United States Patent
Otsuga et al.

(10) Patent No.: US 7,954,023 B2
(45) Date of Patent: May 31, 2011

(54) SEMICONDUCTOR INTEGRATED CIRCUIT INCLUDING POWER DOMAINS

(75) Inventors: Kazuo Otsuga, Kokubunji (JP); Kenichi Osada, Tokyo (JP); Yusuke Kanno, Kodaira (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 219 days.

(21) Appl. No.: 12/342,015

(22) Filed: Dec. 22, 2008

(65) Prior Publication Data
US 2009/0160544 A1 Jun. 25, 2009

(30) Foreign Application Priority Data
Dec. 25, 2007 (JP) ................. 2007-331731

(51) Int. Cl.
*G01R 31/28* (2006.01)
(52) U.S. Cl. ...................................... 714/726
(58) Field of Classification Search .................. 714/726, 714/727, 729
See application file for complete search history.

(56) References Cited

U.S. PATENT DOCUMENTS

| | | | | |
|---|---|---|---|---|
| 7,263,640 | B2 * | 8/2007 | Kobayashi | 714/726 |
| 7,269,780 | B2 * | 9/2007 | Arima et al. | 714/764 |
| 7,346,820 | B2 * | 3/2008 | Padhye et al. | 714/726 |
| 7,571,402 | B2 * | 8/2009 | Hossain | 716/5 |
| 7,788,558 | B2 * | 8/2010 | Shimooka | 714/726 |
| 2005/0146953 | A1 | 7/2005 | Mizuno et al. | |

FOREIGN PATENT DOCUMENTS

| | | |
|---|---|---|
| JP | 2003-218682 A | 7/2003 |
| JP | 2005-086215 A | 3/2005 |
| JP | 2005-210009 A | 8/2005 |
| JP | 2006-220433 A | 8/2006 |

* cited by examiner

*Primary Examiner* — James C Kerveros
(74) *Attorney, Agent, or Firm* — Miles & Stockbridge P.C.

(57) ABSTRACT

A scan chain configuration and a control method for the same are provided, which are optimized for the leakage current reduction technique by a vector input in SoC in which many functional blocks are mounted. The semiconductor integrated circuit includes: plural power domains (Area1-AreaN) which have plural functional blocks; power switches (PSW1-PSWN) which can supply a power source for operation to the power domains; a scan chain provided for every power domain, and a memory unit (VEC) which supplies, to a scan chain, a vector to enable shifting to a low-leakage state. By re-coupling the scan chain only to a non-operating functional block, it is possible to perform shifting to a low-leakage state for a short time.

20 Claims, 17 Drawing Sheets

SEMICONDUCTOR INTEGRATED CIRCUIT INCLUDING POWER DOMAINS

CLAIM OF PRIORITY

The Present application claims priority from Japanese application JP 2007-331731 filed on Dec. 25, 2007, the content of which is hereby incorporated by reference into this application.

FIELD OF THE INVENTION

The present invention relates to a semiconductor integrated circuit, in particular, to technology which is effective when applied to a system LSI or a micro-processor for portable devices.

BACKGROUND OF THE INVENTION

In recent years, owing to advancement in semiconductor process technology, the minimum processing size is getting smaller and smaller. As a result, the number of transistors mounted in one chip increases, and SoC (System On a Chip) in which the prime functions of a computer are embedded in one chip becomes generalized. SoC integrates functional blocks, such as a micro-processor, an interface controller, a multimedia digital signal processor, a memory, etc. to one chip. By advancing such integration, an area necessary for implementation can be reduced and cost can be also markedly cut down, compared with a system formed by plural chips with an equivalent function. On the other hand, There arises a problem of increased power consumption of SoC in which a high level of integration is advanced. The increase of the power consumption leads to the increase in the heat production of a chip, and to the decrease in the reliability of the chip. In a portable device, the increase of the power consumption reduces a battery operating time. The increase of the power consumption is mainly attributable to the increased number of transistors integrated in a chip, the increased leakage current of a transistor accompanying miniaturization, and the increased operating frequency.

The power consumption can be classified into two kinds, a DC power and an AC power. The DC power originates in leakage current, and is consumed even in the state where the circuit is not operating, as long as the power supply voltage is applied. On the other hand, the AC power is a charge and discharge power of a transistor, and is consumed as operating power while the circuit is operating. In order to reduce the power consumption, it is important to reduce both DC power and AC power. In the following, however, paying attention to the DC power, the reduction technique proposed so far is explained.

SoC is a collective entity of power domains divided for every function. When looking at the operating state of SoC in a certain moment, all the circuits are not operating. This is because only the power domain necessary for the execution of application should be operating. Therefore, by cutting off the power supply to a power domain which is not used, the leakage current of the power domain can be brought to naught. This technique is described by Document 1 (Japanese patent laid-open No. 2003-218682), for example.

On the other hand, another technique of reducing the leakage current without performing power cut-off is also proposed. In the technique, the leakage current is reduced by setting the input value of a combination logic to a certain value compulsorily. This technique sets up the input value of a combination logic using a scan chain so that the leakage current may be reduced. This technique utilizes the fact that the leakage current of a chip changes depending on the value of a signal inputted into an input terminal of the combination logic. Taking an example of an AND gate of two inputs, the flowing leakage current differs depending on an input vector (00, 10, 01, 11). Namely, if it is possible to set up, directly in a combination logic, an input vector with which the leakage current becomes low in the time of sleep, etc., the DC power, i.e., the leakage current, can be reduced.

On the other hand, the direct control of a flip-flop output value of a sequential circuit, used as the input value of the combination logic, is difficult. Therefore, a multiplexer is added to the data input terminal of the flip-flop, and a path (scan chain) which couples flip-flops in series is formed apart from the usual path. The direct control of a value of the flip-flop is enabled by switching the data input source of the flip-flop to the normal path or to the scan chain path by a scan control signal. Namely, the input vector of the combination logic which exists in the normal path is set up using this scan chain, accordingly the leakage current is reduced. Although a scan chain is usually a path which is added for the sake of the design for testability, the scan chain is used here for leakage current reduction. This technique is described by Document 2 (Japanese patent laid-open No. 2006-220433), Document 3 (Japanese patent laid-open No. 2005-210009), and Document 4 (Japanese patent laid-open No. 2005-086215).

SUMMARY OF THE INVENTION

Document 2, Document 3, and Document 4 have described a method and configuration for the leakage current control using a scan chain in the level of a single-body functional block of SoC; however, they have failed to describe a control method and configuration for the scan chain in the whole SoC.

Firstly, in SoC in which many functional blocks are mounted, optimal configuration of a scan chain to be used for the leakage current reduction is not clarified. The vector input time to a scan chain depends on the number of stages of flip-flops in one scan chain. That is, the vector input time becomes longer in proportion to the number of stages of flip-flops. In order to shorten the vector input time, it is desirable that the scan chain has configuration in which a vector can be inputted only into a functional block not operating at the time of application execution. However, the configuration of the usual scan chain does not take into consideration the operation/non-operation state of the functional block at the time of application execution. In that case, the overhead time for the vector input is large, since a vector is inputted also into an operating functional block.

Secondly, proper use of the power gating control and the clock gating control, which are known as another low-power consumption technique, is not clarified. Also in this case, in consideration of the operation/non-operation state of the functional block at the time of application execution, each functional block should be set to the suitable low-power consumption state. If the circumstances described above is realized, large reduction of leakage current can be achieved.

The present invention has been made in view of the above circumstances and provides a semiconductor integrated circuit, usable in SoC with many functional blocks mounted, and having a scan chain configuration and a control method, which are optimized for the leakage current reduction technique by a vector input. The other purposes and the new feature of the present invention will become clear from the description of the present specification and the accompanying drawings.

The following simply explains an outline of typical one of the inventions disclosed by the present application.

Namely, a semiconductor integrated circuit according to the present invention comprises: a first power domain including a first functional block having a first flip-flop, a second flip-flop, and a first combination logic, and a second functional block having a third flip-flop, a fourth flip-flop, and a second combination logic; a first scan chain including the first flip-flop and the second flip-flop; and a second scan chain including the third flip-flop and the fourth flip-flop. The semiconductor integrated circuit is able to be set to one of a first mode, a second mode, and a third mode. The first mode cuts off power to be supplied to the first power domain. The second mode inputs a first vector, which is independent of a previous-stage circuit of the first flip-flop and a previous-stage circuit of the second flip-flop, to the first combination logic via the first scan chain, and subsequently, cuts off a first clock signal to be supplied to the first functional block. The third mode does not input the first vector but only cuts off the first clock signal.

Alternatively, a semiconductor integrated circuit according to the present invention comprises: a first power domain including a first functional block having a first flip-flop, a second flip-flop, and a first combination logic, and a second functional block having a third flip-flop, a fourth flip-flop, and a second combination logic; a first switch which supplies power to the first power domain; a first register which controls the first switch; a second register having a first bit to be used to set whether or not a first clock signal is inputted to the first functional block, and a second bit to be used to set whether or not a second clock signal is inputted to the second functional block; a first scan chain including the first flip-flop and the second flip-flop; a second scan chain including the third flip-flop and the fourth flip-flop; and a third register having a third bit and a fourth bit. The third bit is used to set whether or not a first vector is inputted via the first scan chain, in order to set the first combination logic in a less leakage state compared with a state without inputting the first vector. The fourth bit is used to set whether or not a second vector is inputted via the second scan chain, in order to set the second combination logic in a less leakage state compared with a state without inputting the second vector.

As a further alternative, a semiconductor integrated circuit according to the present invention comprises: a first power domain including a first functional block having a first flip-flop, a second flip-flop, and a first combination logic, and a second functional block having a third flip-flop, a fourth flip-flop, and a second combination logic; a first switch which sets enabling and disenabling of power supply to the first power domain; a first register which controls the first switch; a first scan chain including the first flip-flop and the second flip-flop; a second scan chain including the third flip-flop and the fourth flip-flop; and a second register having a first bit to be used to set whether or not a first clock signal is inputted to the first functional block, a second bit to be used to set whether or not a second clock signal is inputted to the second functional block, and a third bit to be used to set whether or not a first vector and a second vector are inputted. The first vector is inputted via the first scan chain in order to set the first combination logic in a low leakage state. The second vector is inputted via the second scan chain in order to set the second combination logic in a low leakage state.

The following explains briefly the effect acquired by the typical one of the inventions disclosed by the present application.

In SoC which is a collective entity of functional blocks, it becomes possible to reduce the leakage current at the time of application execution.

BRIEF DESCRIPTION OF THE DRAWINGS

The present invention will become fully understood from the detailed description given hereinafter and the accompanying drawings given by way of illustration only, and thus are not intended as a definition of the limits of the present invention, wherein.

DETAILED DESCRIPTION OF THE PREFERRED EMBODIMENTS

Hereafter, the best mode for practicing the present invention is explained, with reference to the accompanying drawings. In the following drawings, the same reference number is attached to the same member, and the repetitive explanation thereof is omitted. First, each circuit configuration is explained, then a control method is described.

Figure 1:
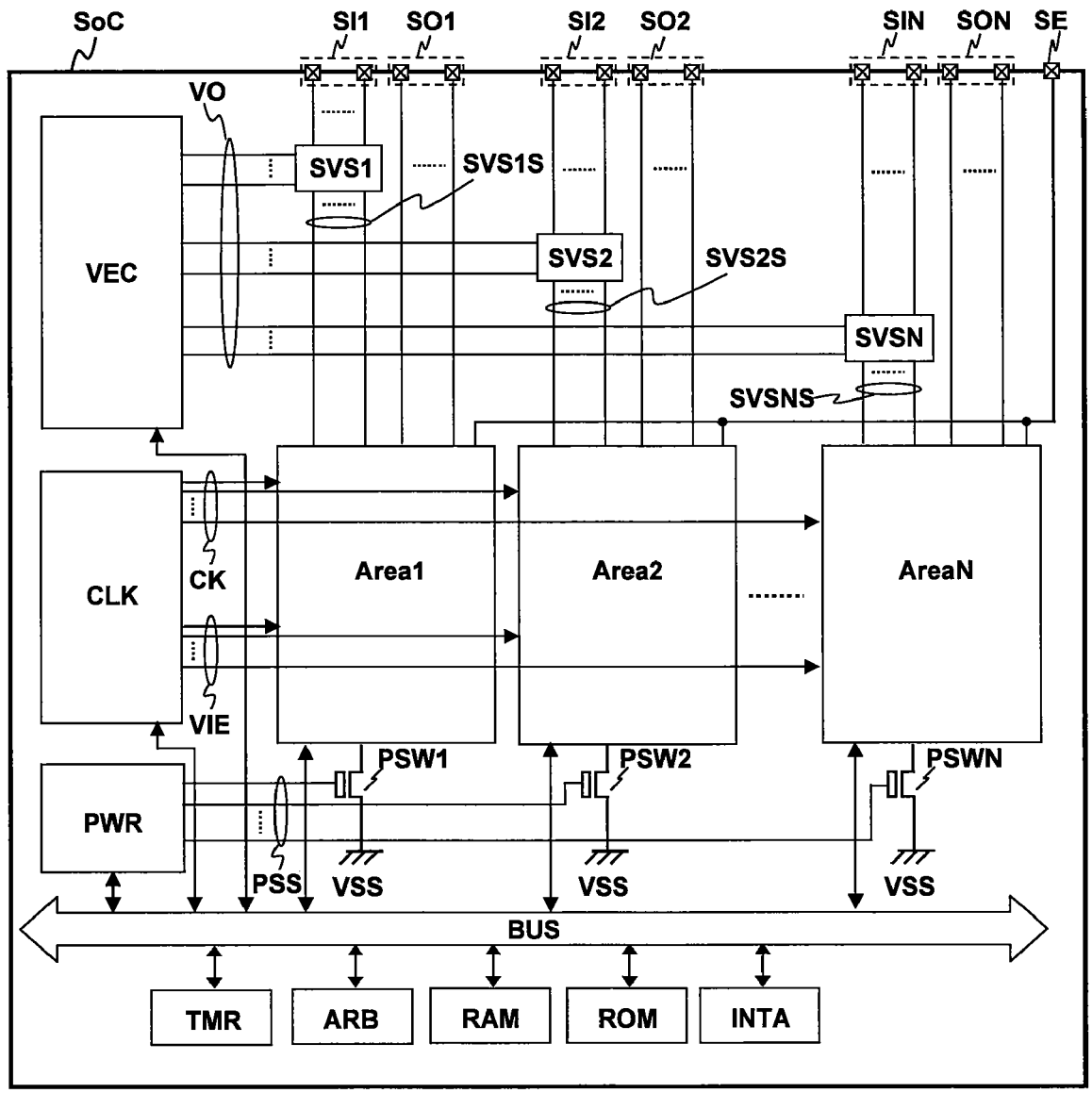
FIG. 1 is a block diagram illustrating an example of SoC configuration in a first embodiment of a semiconductor integrated circuit according to the present invention.

FIG. 1 illustrates a principal part of a semiconductor integrated circuit according to a first embodiment of the present invention. Although not restricted in particular, the circuit of FIG. 1 is formed on one semiconductor substrate such as a single-crystal silicone by the publicly-known semiconductor integrated circuit technology which manufactures CMOS (complementary MOS transistor), a bipolar transistor, etc.

A system on a chip SoC comprises a vector supply unit VEC, a clock controller CLK, a power gating controller PWR, power domains Area1-AreaN, scan vector input selectors SVS1-SVSN, power switches PSW1-PSWN, a timer TMR, a random access memory RAM, a read-only memory ROM, a bus arbiter ARB, an interruption controller INTA, an internal bus BUS, scan-in pads SI1-SIN, scan-out pads SO1-SON, and a scan enable pad SE. The symbol VO denotes an output signal group from the vector supply unit VEC, the symbol CK denotes a clock signal group from the clock controller CLK, the symbol VIE denotes a vector enable signal group from the clock controller CLK, the symbol PSS denotes a power switch control signal group from the power gating controller PWR, and the symbols SVS1S-SVSNS denote output signal groups from the scan vector input selectors SVS1-SVSN, respectively. The vector supply unit VEC can supply to each functional block a vector which shifts each functional block to a low leakage current state. The vector supply unit VEC includes RAM, ROM, a fuse, a nonvolatile memory, etc. It will be clarified henceforth that shifting to a low-power consumption state is realized in a short time, by forming the unit of a scan chain for every power domain, as illustrated in FIG. 1.

Figure 2:
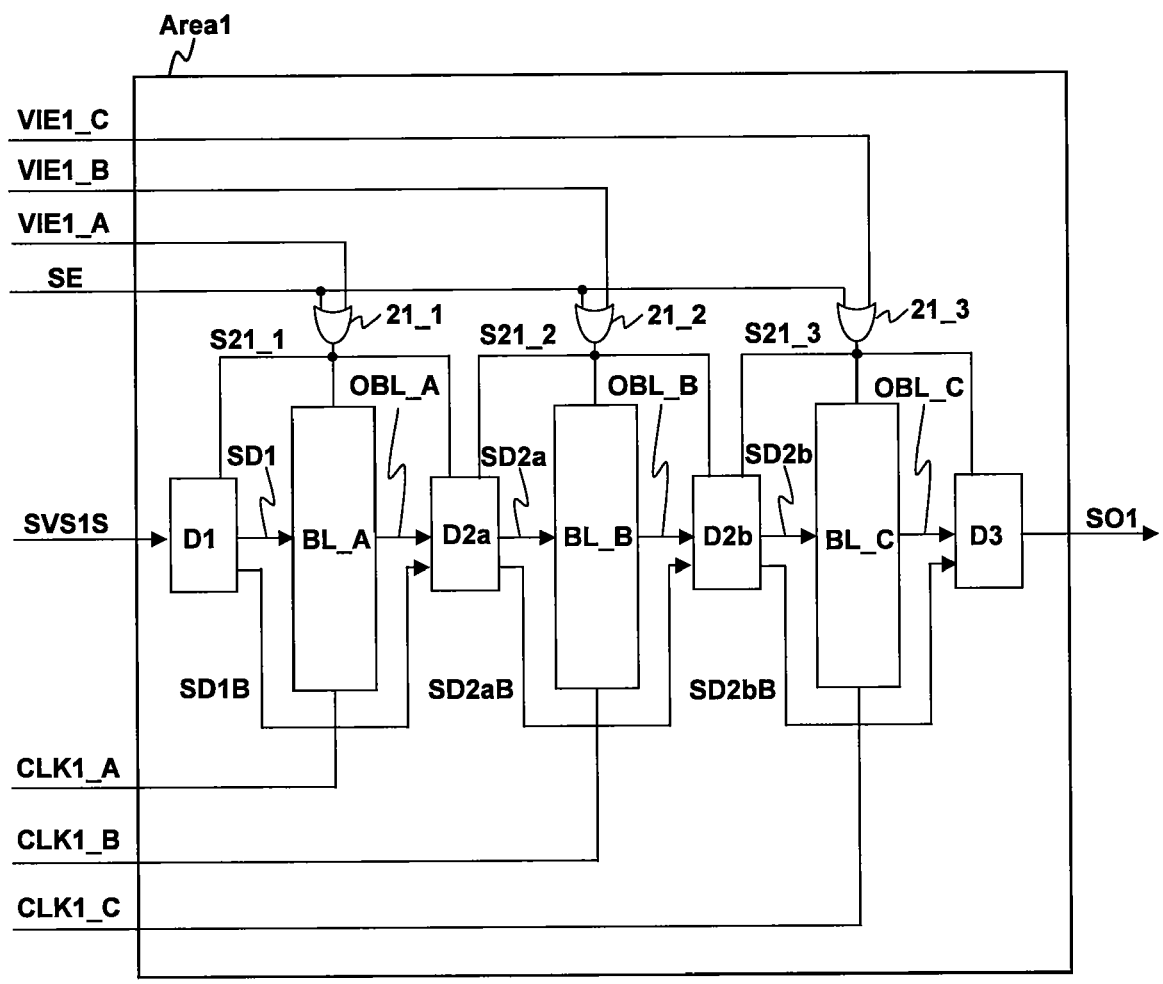
FIG. 2 is a block diagram illustrating an example of scan chain configuration in a power domain in the first embodiment of the semiconductor integrated circuit according to the present invention.

FIG. 2 illustrates the circuit configuration of the power domain according to the first embodiment of the present invention. Although explanation here is given to the power domain Area1 of FIG. 1 as an example, it is needless to say that the other power domains also have the circuit configuration similar to the power domain Area1.

The power domain Area1 includes OR gates $21\_1$-$21\_3$, bypass circuits D1, D2$a$, D2$b$, and D3, and functional blocks BL_A, BL_B, and BL_C. The symbols VIEL_A-VIEL_C denote vector enable signals which are inputted into the power domain Area1 among the vector enable signal group VIE. The symbols CLK1_A-CLK1_C denote clock signals which are inputted into the power domain Area1 among the clock signal group CK. A power domain is defined here as a unit which has a power source controlled through the corresponding one of the power switches PSW1-PSWN, by a bit of the power gating controller PWR, the bit being corresponding to the power domain concerned. A functional block is defined as a unit which has an internal clock cut off by a bit of a clock gating register CLKSTP_REG provided in the clock controller CLK, the bit being corresponding to the functional block concerned. It is assumed that the corresponding bit is one bit in the present invention. However, it is not restricted to the present configuration but the other configuration which exhibits the equivalent effect may be employed. For example, two or more bits may be used corresponding to every functional block. In this way, by providing plural functional blocks in a power domain, it becomes possible to cut off a clock signal for every functional block, and the control can be performed in a finer-grained unit. Accordingly, there is an advantage that lower power consumption can be realized.

The symbols $S21\_1$-$S21\_3$ denote logical addition values of vector enable signals VIEL_A-VIEL_C and a scan enable pad SE, respectively. In FIG. 2, it is assumed that the number of functional blocks is three. However, it is not restricted to three pieces but plural (two or more) functional blocks may be included. The output signal group SVS1S from the scan vector input selector SVS1 is shown as one line in FIG. 2, however, the output signal group SVS1S may have plural lines. Since the scan chain, which is originally used for a test, can be used as a circuit for inputting a low-leakage vector by the present configuration, there is an advantage that the path of a low-leakage vector input can be provided without increasing area. There is another advantage that the test mode and the low-leakage vector input mode are controllable easily from the exterior, with the use of the scan enable pad SE.

Figure 3:
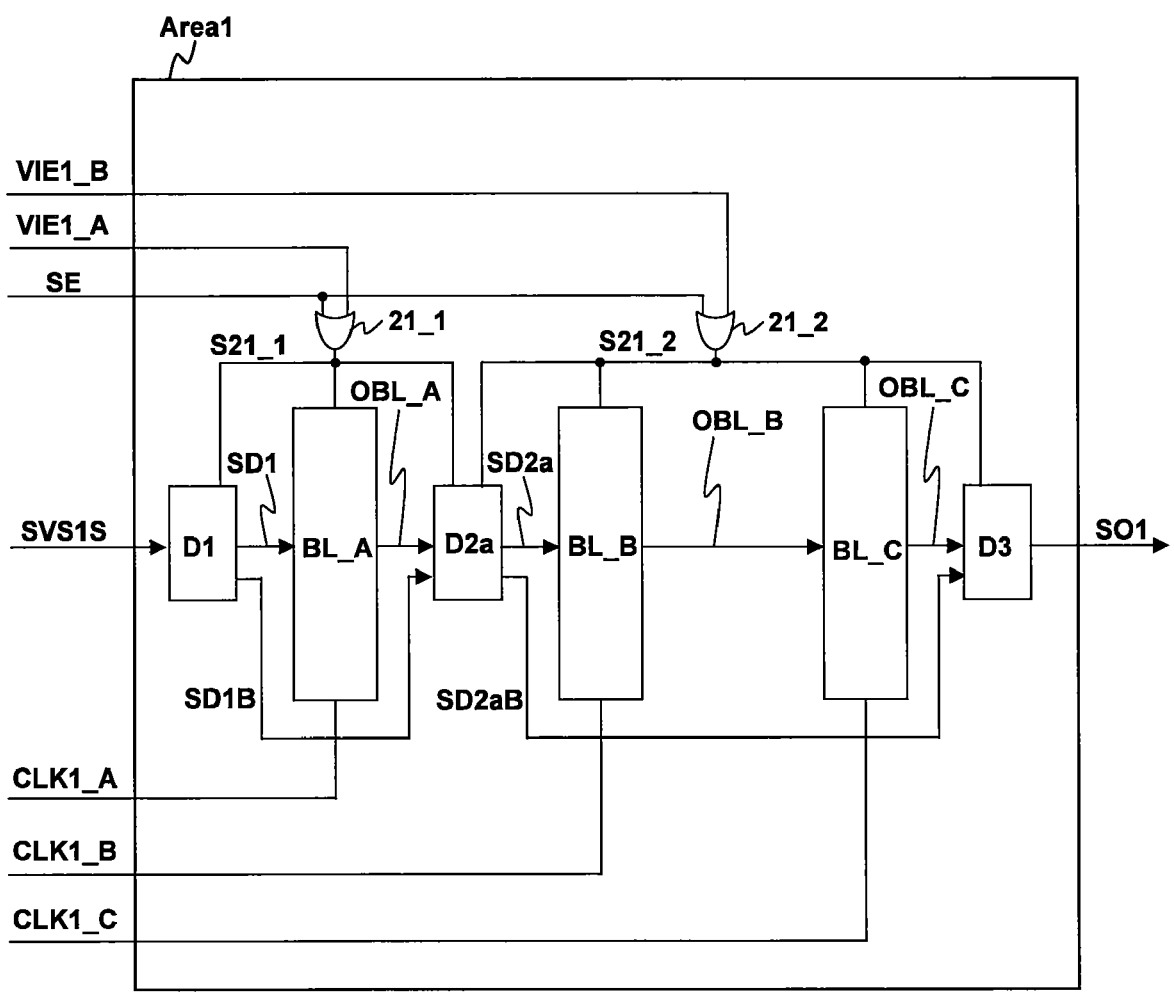
FIG. 3 is a block diagram illustrating an example of bypass circuit configuration in the first embodiment of the semiconductor integrated circuit according to the present invention.

FIG. 3 illustrated another circuit configuration of a bypass circuit. Here, the bypass circuit D2$b$ is not provided, but the signal inputted into the bypass circuit D2$a$ is outputted to the functional block BL_B or the bypass circuit D3. The signal inputted into the functional block BL_B is directly outputted to the functional block BL_C, and the signal from the bypass circuit BL_B or the functional block BL_C is outputted to the bypass circuit D3. In such circuit configuration, since the low-leakage vector must be inputted into the functional block BL_C, there are shortcomings that an overhead time until the completion of shifting to a low power consumption state becomes long. However, such circuit configuration is effective in exhibiting advantage that the area can be reduced as much as the decrease in the number of the bypass circuits.

Figure 4:
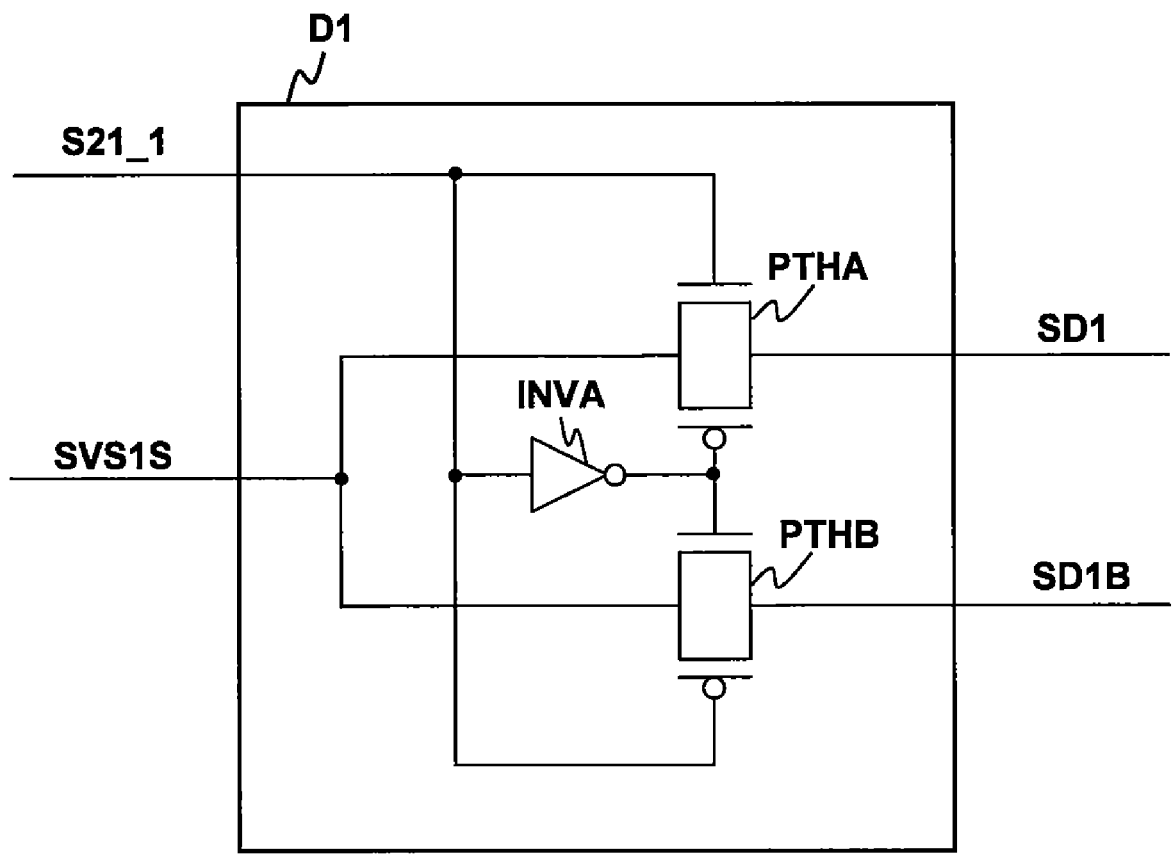
FIG. 4 is a block diagram illustrating an example of bypass circuit configuration in the first embodiment of the semiconductor integrated circuit according to the present invention.

FIG. 4 illustrates the circuit configuration of the bypass circuit D1 according to the first embodiment of the present invention. The bypass circuit D1 includes an inverter INVA and path transistors PTHA and PTHB. When the logical addition value $S21\_1$ is "1", the path transistor PTHA is turned on and the path transistor PTHB is turned off, and the signal SVS1S is outputted as a signal SD1. When the logical addition value $S21\_1$ is "0", the path transistor PTHA is turned off and the path transistor PTHB is turned on, and the signal SVS1S is bypassed as a signal SD1B. The bypass circuit D1 is installed as a bypass circuit of the first stage of the power domain.

Figure 5:
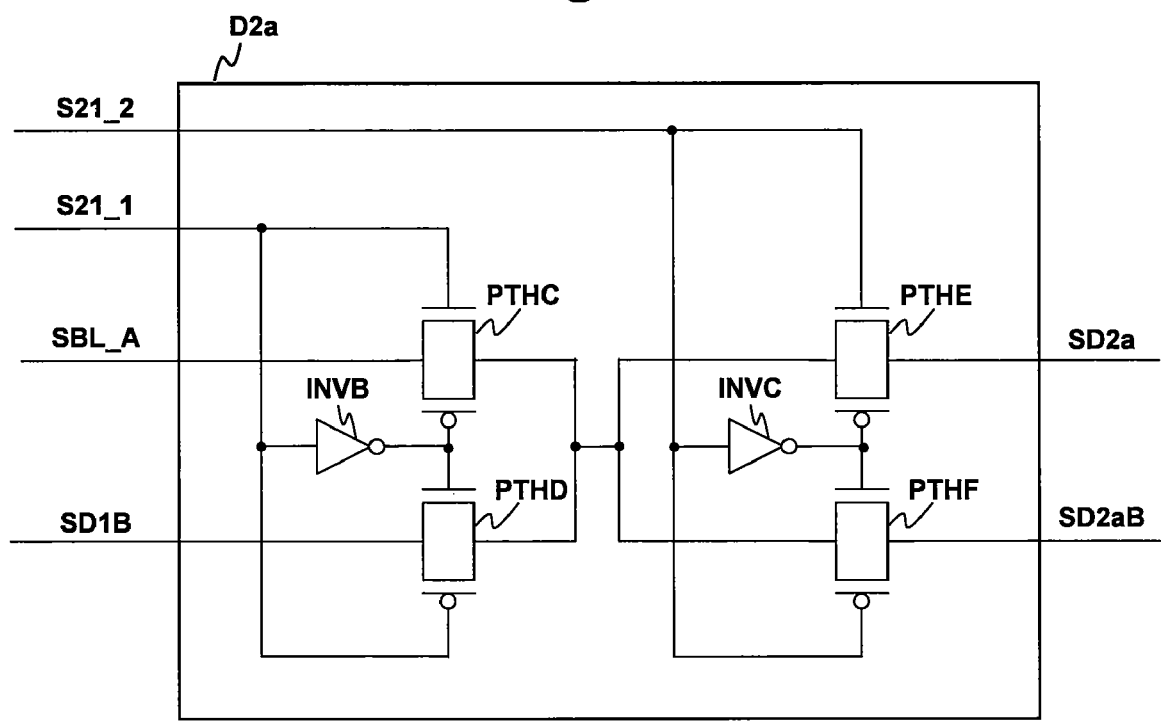
FIG. 5 is a block diagram illustrating an example of bypass circuit configuration in the first embodiment of the semiconductor integrated circuit according to the present invention.

FIG. 5 illustrates the circuit configuration of a bypass circuit D2$a$ according the first embodiment of the present invention. The bypass circuit D2$a$ includes inverters INVB, INVC and path transistors PTHC to PTHF. When the logical addition value $S21\_1$ is "1" and the logical addition value $S21\_2$ is "1", the signal SBL_A is outputted as a signal SD2$a$. When the logical addition value $S21\_1$ is "1" and the logical addition value $S21\_2$ is "0", the signal SBL_A is outputted as a signal SD2$a$B. When the logical addition value $S21\_1$ is "0" and the logical addition value $S21\_2$ is "1", the signal SD1B is outputted as the signal SD2$a$. When the logical addition value $S21\_1$ is "0" and the logical addition value $S21\_2$ is "0", the signal SD1B is outputted as the signal SD2$a$B. A bypass circuit installed between functional blocks has the same circuit configuration as the bypass circuit D2$a$. That is, the bypass circuit D2$b$ has the same circuit configuration as the bypass circuit D2$a$.

Figure 6:
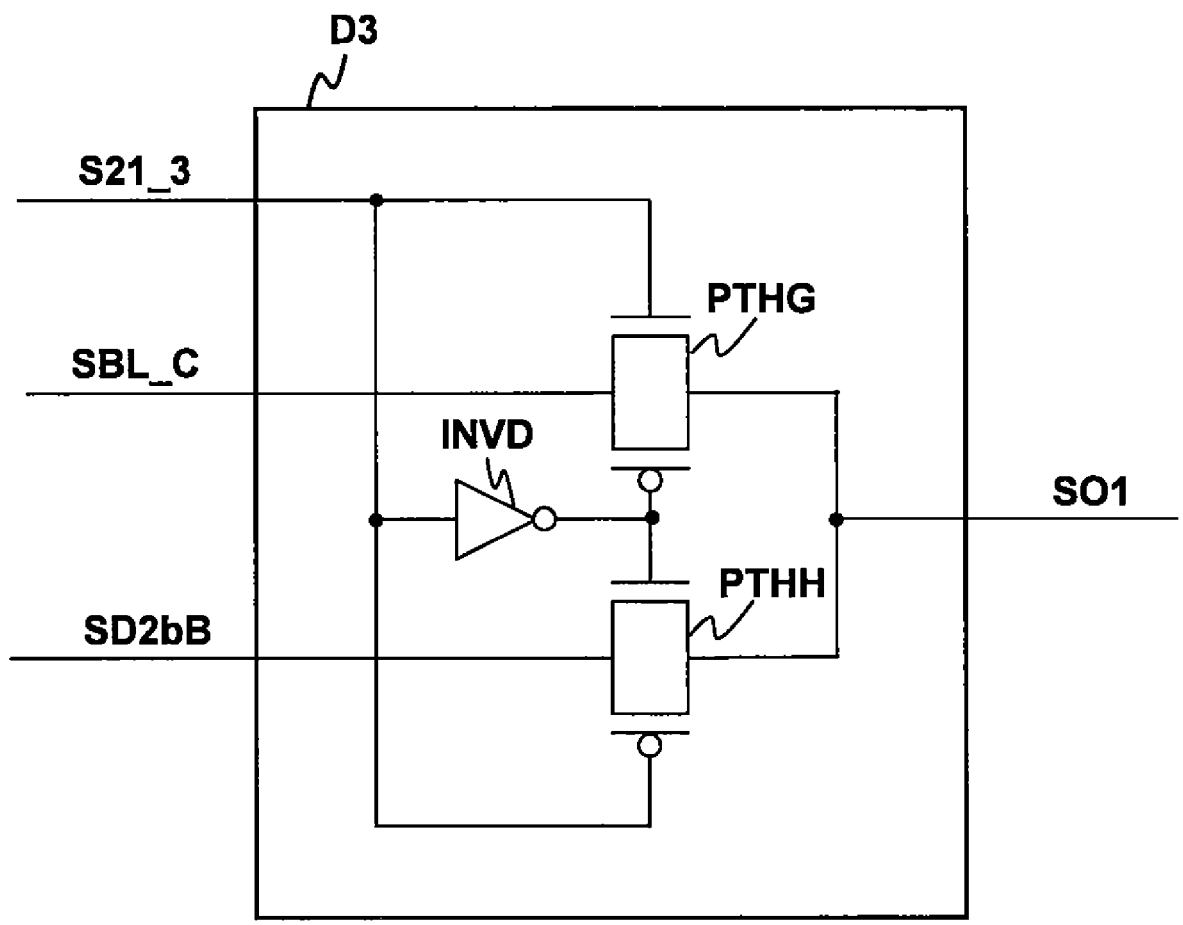
FIG. 6 is a block diagram illustrating an example of bypass circuit configuration in the first embodiment of the semiconductor integrated circuit according to the present invention.

FIG. 6 illustrates the circuit configuration of the bypass circuit D3 according to the first embodiment of the present invention. The bypass circuit D3 includes an inverter INVD and path transistors PTHG and PTHH. When the logical addition value $S21\_3$ is "1", the signal SBL_C is outputted as a signal SO1. When the logical addition value $S21\_3$ is "0", the signal SD2$b$B is outputted as the signal SO1. The bypass circuit D3 is installed as a bypass circuit of the final stage of the power domain.

Figure 7:
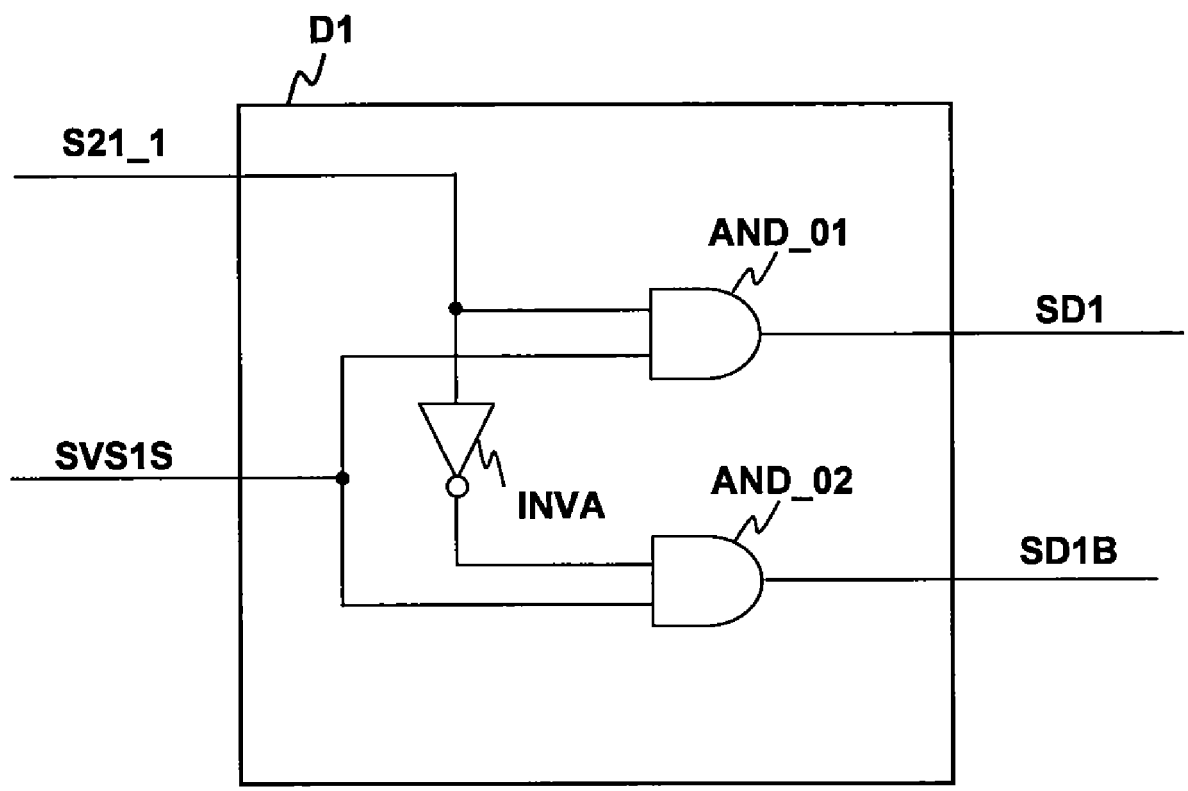
FIG. 7 is a block diagram illustrating an example of selector circuit configuration in the first embodiment of the semiconductor integrated circuit according to the present invention.
Figure 8:
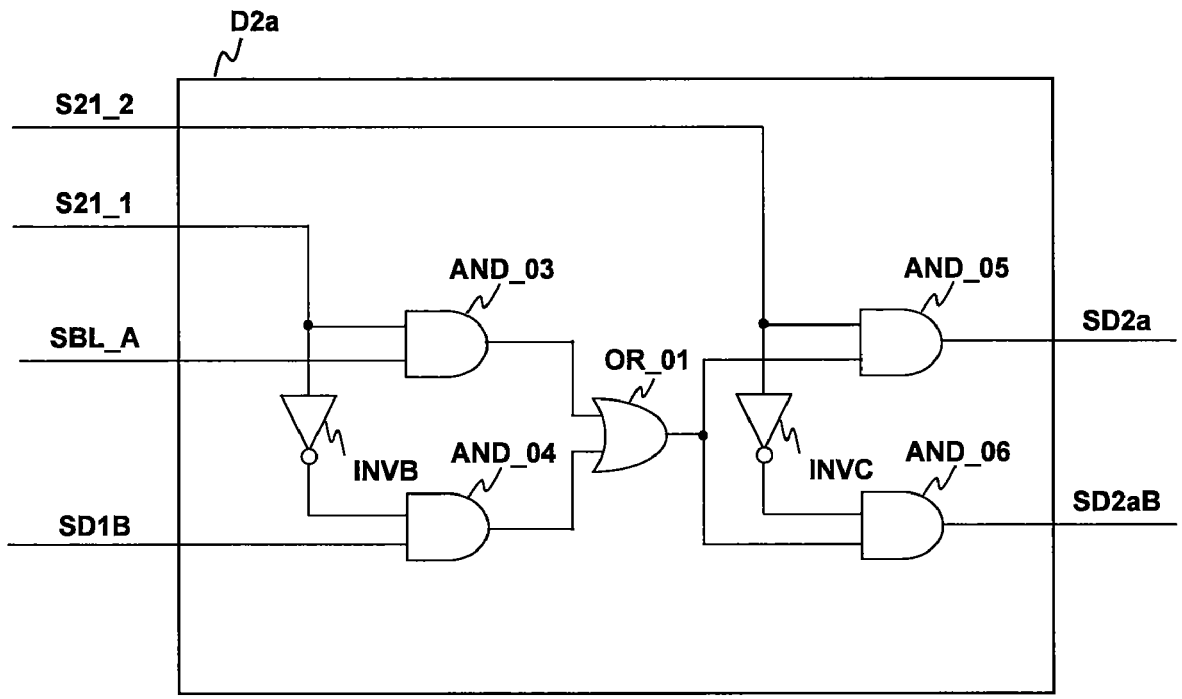
FIG. 8 is a block diagram illustrating an example of a power gating controller in the first embodiment of the semiconductor integrated circuit according to the present invention.
Figure 9:
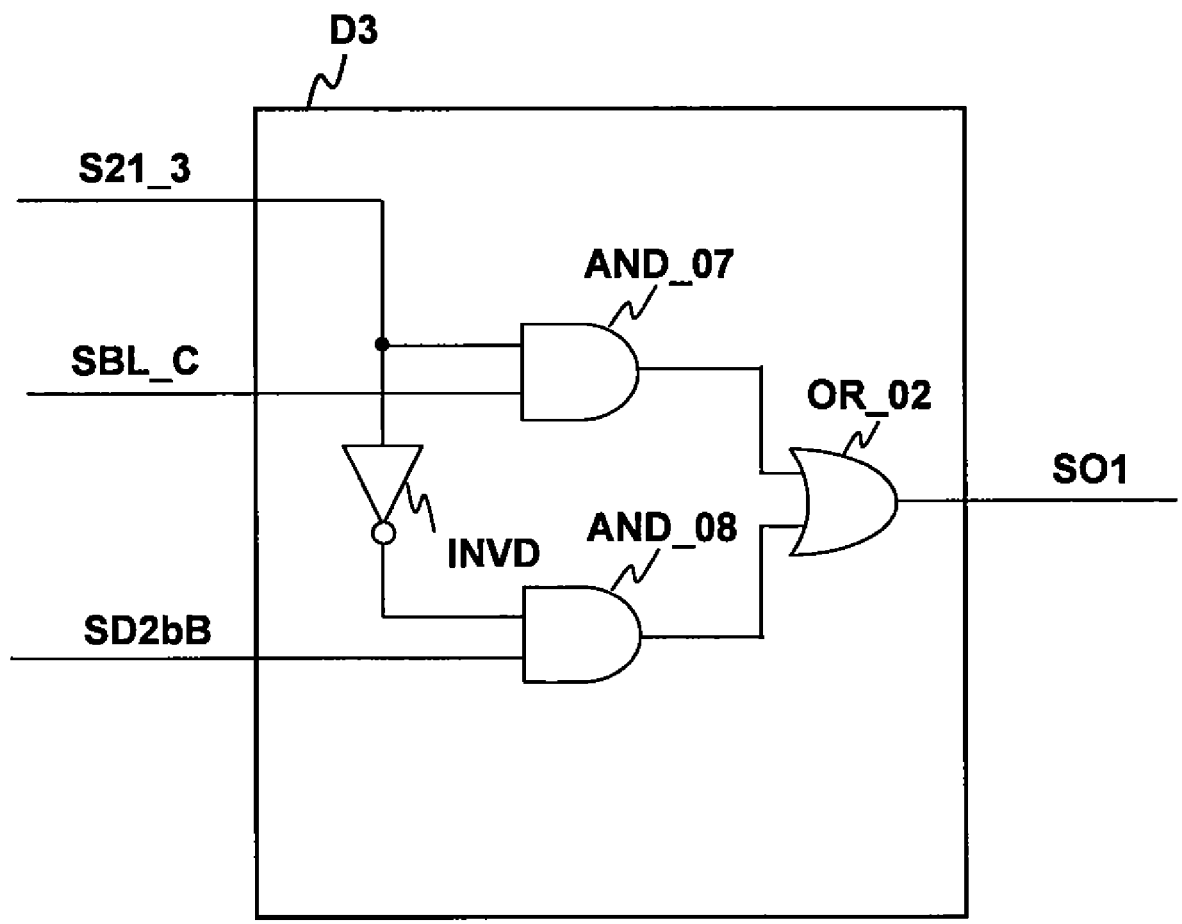
FIG. 9 is a block diagram illustrating an example of a clock controller in the first embodiment of the semiconductor integrated circuit according to the present invention.

Here, the configuration of each bypass circuit of FIG. 4 to FIG. 6 is not restricted to the configuration described above;

however, another configuration is possible as long as the equivalent effect can be exhibited. For example, as illustrated in FIG. 7 to FIG. 9, if the pair of path transistors PTHA and PTHB, PTHC and PTHD, and the others are replaced with CMOS gates, the same function is realizable. However, when path transistors are used as in the present invention, the signal transmission with few losses becomes possible in any case of the input signals, since when the input signal is "1", PMOS is suitable for the signal transmission, and when the input signal is "0", NMOS is suitable for the signal transmission.

Figure 10:
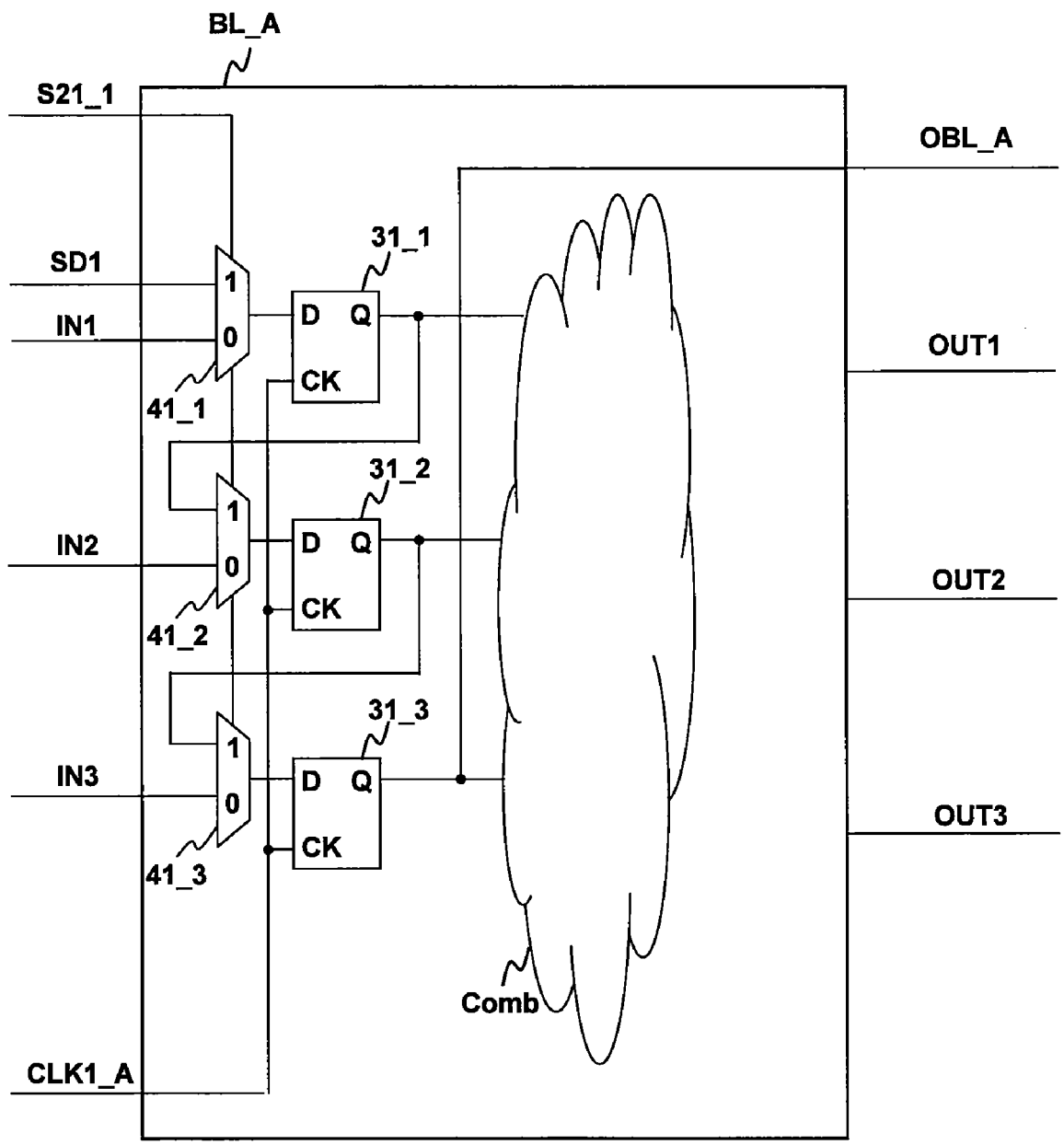
FIG. 10 is a block diagram illustrating an example of functional-block circuit configuration in the first embodiment of the semiconductor integrated circuit according to the present invention.

FIG. 10 illustrates the circuit configuration of the functional block according to the first embodiment of the present invention. FIG. 10 illustrates only a portion of the functional block concerning the present invention, and does not illustrate all the circuit elements of the functional block. Although explanation is given here to the functional block BL_A of FIG. 2 as an example, it is needless to say that the other functional blocks also have the circuit configuration similar to the functional block BL_A.

The functional block BL_A includes flip-flops 31_1-31_3, multiplexers 41_1-41_3, and a combinational circuit Comb. Although the symbols IN1-IN3 are not shown explicitly in FIG. 2, they are the normal input signals to the functional block BL_A. Although the symbols OUT1-OUT3 are not shown explicitly in FIG. 2, they are the normal output signals from the functional block BL_A. The symbol OBL_A denotes a signal to be inputted to the bypass circuit D2a of FIG. 2.

Here, operation of the functional block in the normal operation or at the time of a scan test and in the operation which inputs a low-leakage vector is explained. In the present invention, a vector is defined by the value which is inputted into a combination logic Comb by flip-flops provided in the preceding stage of the combination logic (for example, flip-flops 31_1 to 31_3 in the preceding stage of the combination logic Comb).

In the normal operation, the logical addition value S21_1 becomes "0", the multiplexers 41_1-41_3 select a signal on the side of "0" and output the signal to the flip-flops 31_1-31_3. The flip-flops 31_1-31_3 take in the signal inputted in a terminal D and output to a terminal Q, at the edge when the clock signal CLK1_A rises to "1." On the other hand, at the time of a scan test or when inputting the low-leakage vector, the logical addition value S21_1 is "1", and the multiplexers 41_1-41_3 select a signal on the side of "1." The flip-flop 31_1 takes in the signal inputted in a terminal D (that is the signal SD1) and outputs to a terminal Q, at the edge when the clock signal CLK1_A rises to "1." At the next edge when the clock signal CLK1_A rises to "1", the flip-flop 31_2 takes in the output signal at the terminal Q of the flip-flop 31_1. In this way, at the edges when the clock signal CLK1_A rises to "1", the value SD1 is sequentially shifted from the flip-flop 31_1 to the flip-flop 31_3. The input signal of the combination logic Comb can be controlled by such a scheme. In this way, by providing a multiplexer in the preceding stage of a flip-flop to enable switch-over of input between the low-leakage vector and the normal signal, it becomes possible to operate by switching over the mode of inputting the low-leakage vector and the mode of the usual operation, without changing the configuration of circuits in the subsequent stages of the multiplexer.

In the above example, three input-output signals and three flip-flops are assumed, however, the number of input-output signals and flip-flops is not restricted to the example. The number of input-output signals may be arbitrary, and the number of flip-flops may also be arbitrary, depending on design.

As described above, when adopting the scan chain configuration illustrated in FIGS. 2-10, it will become possible to input a low-leakage current vector to any desired functional block. Namely, when it is desired to input a vector only to the functional block BL_B, the vector enable signals VIE_A and VIE_C are set as "0", and the vector enable signal VIE_B is set as "1." The scan enable pad SE is set as "0" at the time of normal operation. The output destination of the bypass circuit D1 and the input source of the bypass circuit D2a are set as the signal SD1B, the output destination of the bypass circuit D2a is set to the signal SD2a. Accordingly, the signal SVS1S can be directly inputted into the functional block BL_B, without passing the functional block BL_A. The input source of the bypass circuit D2b is the output signal of the functional block BL_B, and the output destination of the bypass circuit D2b is set as the signal SD2bB. Namely, when a low-leakage current vector is inputted to the functional block BL_B, it is possible to reduce the cycle time as much as the number of stages of the flip-flops of the functional block BL_A, and it is possible to shift the functional block BL_B to a low-leakage state for a short time.

Figure 11:
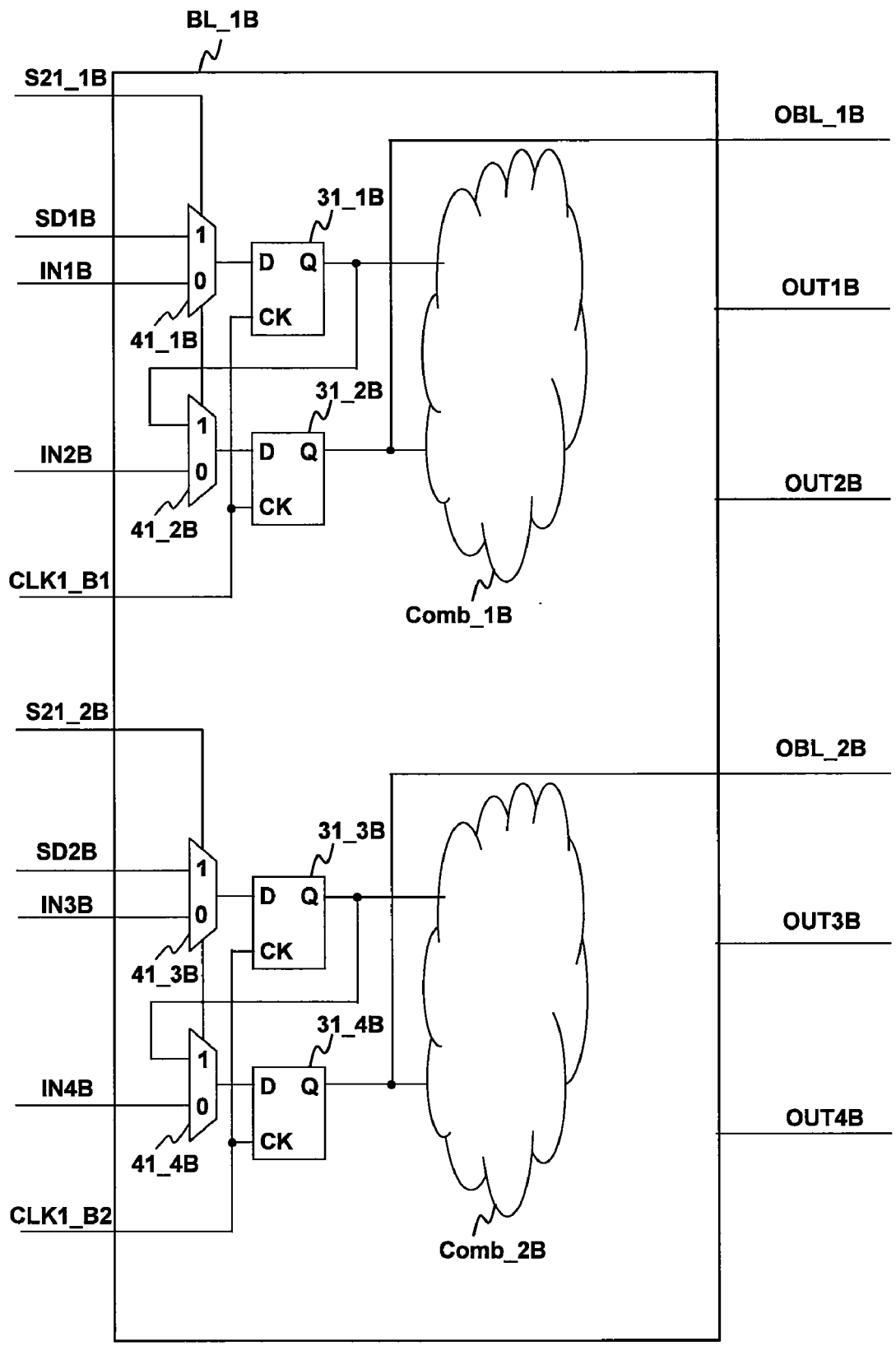
FIG. 11 is a block diagram illustrating a circuit configuration of a functional block BL_B into which clocks CLK1_B1 and CLK1_B-2 are inputted as another input method of a clock signal.

FIG. 11 illustrates the circuit configuration of the functional block BL_B to which clock signals CLK1_B1 and CLK1_B2 are inputted, as another input method of the clock signal.

Here, the clock signals CLK1_B1 and CLK1_B2 are inputted to the functional block BL_B. In this way, it is also possible to input plural clock signals to a single functional block, and to compose a scan chain to each of the clock signals CLK1_B1 and CLK1_B2. When a single scan chain is provided to a functional block which operates with plural clocks, the scan chain must be operated in synchronization with the slowest clock. However, according to the circuit configuration described above, it becomes possible for each scan chain to operate, synchronizing with the clock which runs at the speed suitable for each scan chain.

Figure 12:
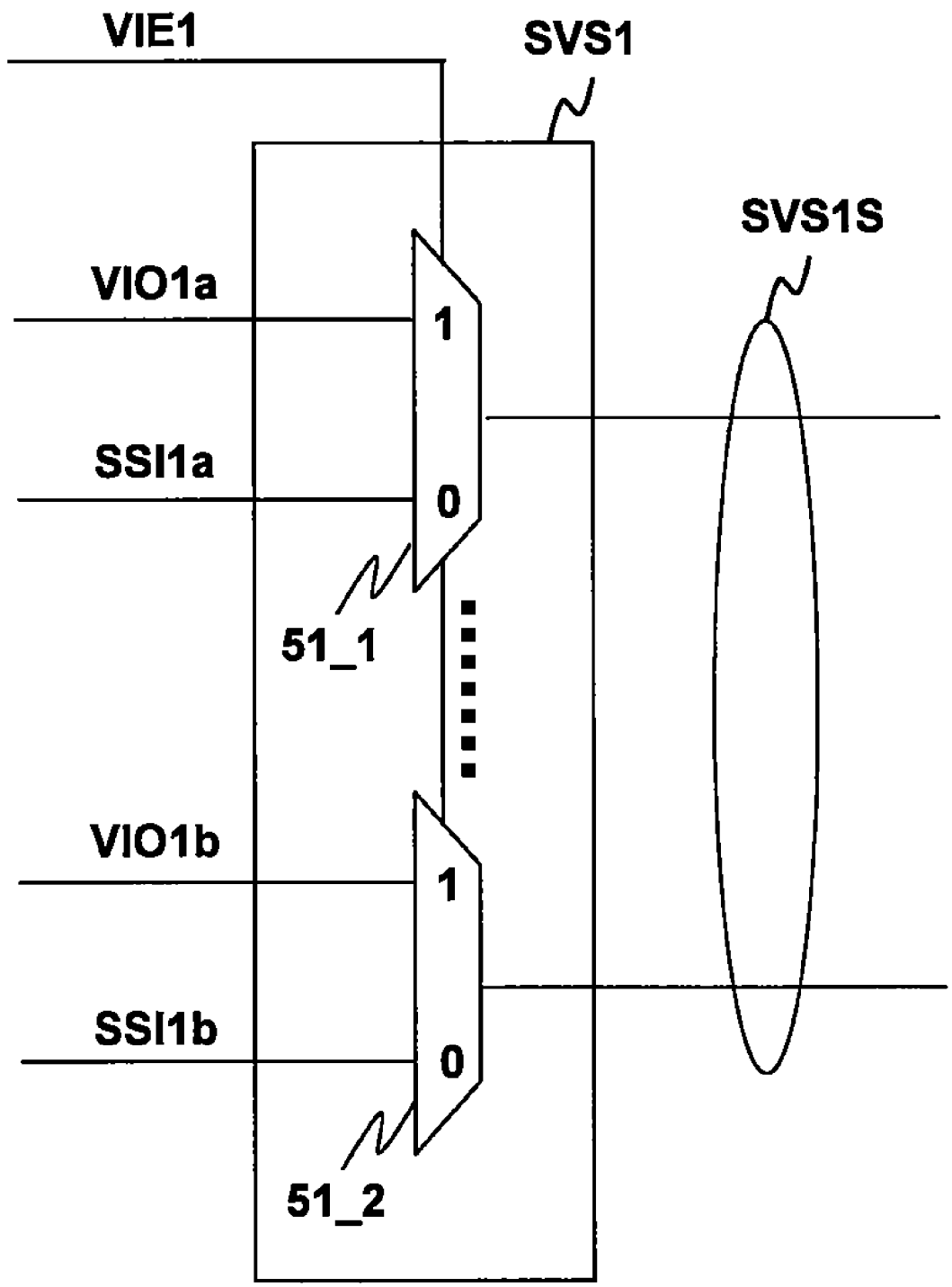
FIG. 12 is a circuit diagram illustrating a scan vector input selector according to the first embodiment of the present invention.

FIG. 12 illustrates the circuit configuration of a scan vector input selector according to the first embodiment of the present invention. In the following explanation, the scan vector input selector SVS1 of FIG. 1 is taken as an example. It is needless to say that the other scan vector input selectors also have the same circuit configuration as the scan vector input selector SVS1.

The scan vector input selector SVS1 includes a multiplexer 51_1 and a multiplexer 51_2. The symbols VIO1a and VIO1b denote the signals which are inputted to the power domain Area1 among the output signal groups from the vector supply unit VEC. The symbols SSI1a and SSI1b denote the signals which are inputted from the scan-in pad SI1. The symbol VIE1 denotes a logical addition of the signal group (VIEL_A-VIEL_C) which are inputted to the power domain Area1 among the output signal groups VIE from the clock controller CLK. Namely, when at least one signal among the VIE1 signal group indicates "1", in other words, when a vector is inputted to at least one functional block in the power domain concerned, the multiplexers 51_1 and 51_2 select the output signal group from the vector supply unit VEC.

Figure 13:
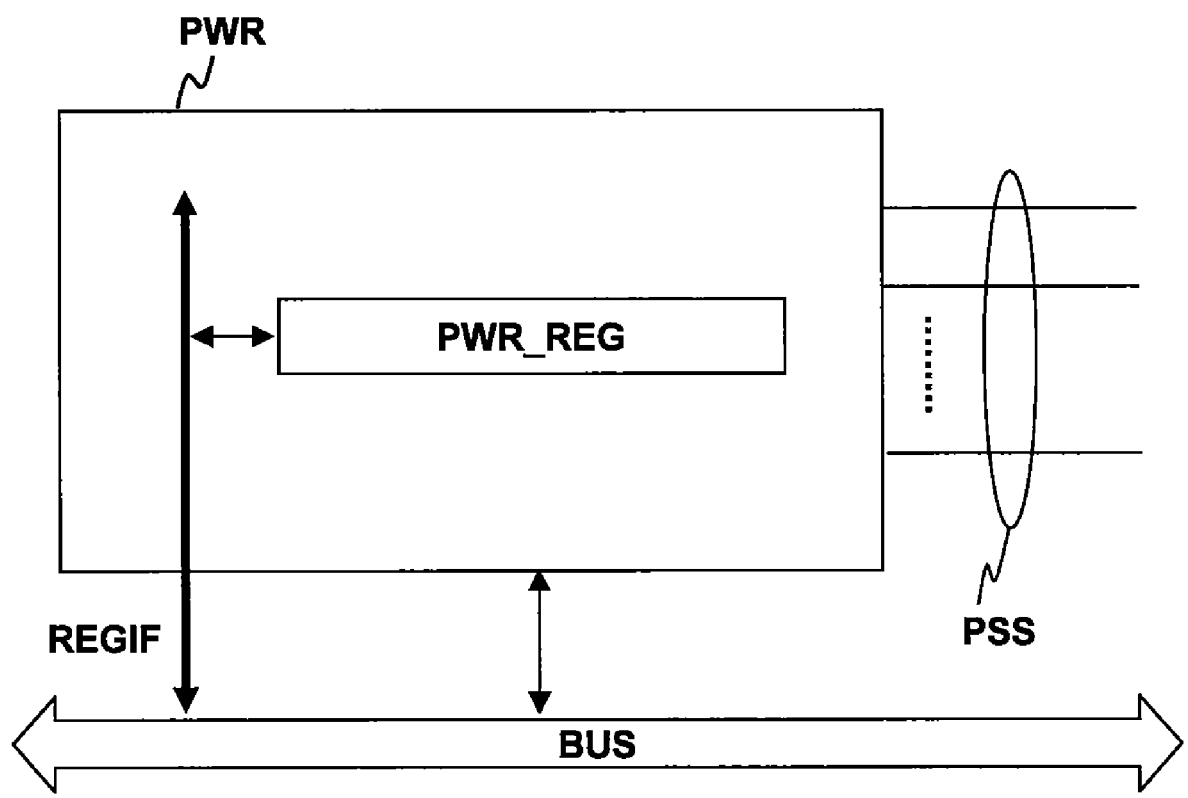
FIG. 13 is a circuit diagram illustrating a power gating controller according to the first embodiment of the present invention.

FIG. 13 illustrates the circuit configuration of the power gating controller according to the first embodiment of the present invention. FIG. 13 illustrates only a portion of the power gating controller according to the present invention, and does not illustrate all the circuit elements of the power gating controller. The power gating controller PWR has a power control register PWR_REG which is coupled with an internal bus BUS via a register interface REGIF. The power control register PWR_REG employs register structure with the number of bits more than the number of power domains at least. When "1" is written in a bit corresponding to one of the power domains, the corresponding PSS signal is set as "0" and the corresponding power switch PSW is turned off. Consequently, the leakage current of the power domain concerned reduces almost to naught.

Figure 14:
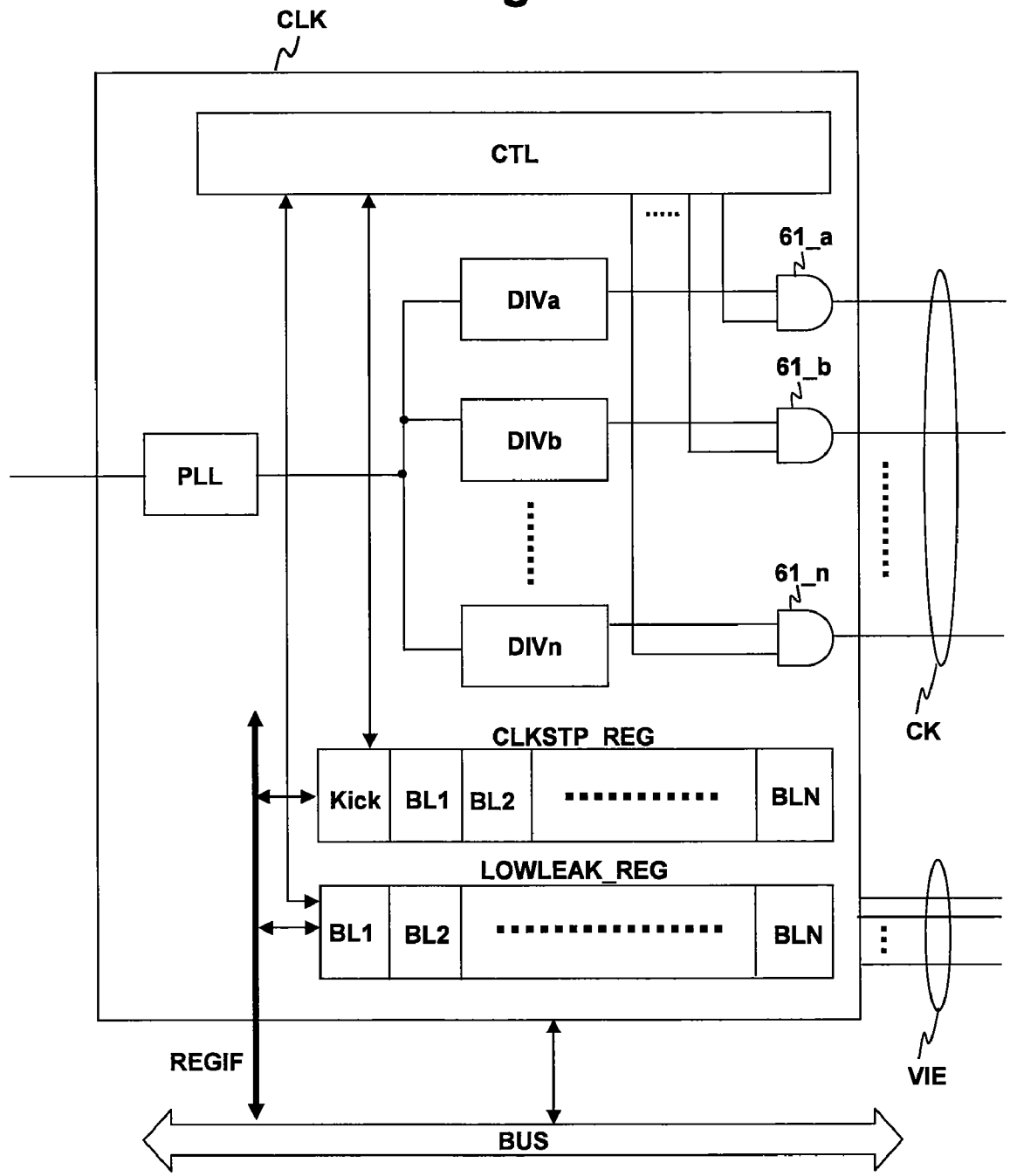
FIG. 14 is a circuit diagram illustrating a clock controller according to the first embodiment of the present invention.

FIG. 14 illustrates the circuit configuration of the clock controller according to the first embodiment of the present invention. FIG. 14 illustrates only a portion of the clock controller according to the present invention, and does not illustrate all the circuit elements of the clock controller.

The clock controller CLK includes a controller CTL, a phase-locked loop PLL, dividers DIVa-DIVn, AND gates 61_a-61_n, a clock gating register CLKSTP_REG, and a low-leakage mode register LOWLEAK_REG. An external crystal oscillation signal CTAL is multiplied by the PLL, divided by each of the dividers DIVa-DIVn, and inputted to the AND gates 61_a-61_n. The divider and the AND gate exist as many as the number of functional blocks at the maximum. Each register is coupled with the controller CTL and the internal bus BUS via the register interface REGIF. The clock gating register CLKSTP_REG has bits at least as many as the number of all the functional blocks in SoC and a Kick bit. This is because an operating functional block and a non-operating functional block differ depending on applications, and the clock current can be reduced by performing clock gating finely depending on the applications. The low-leakage mode register LOWLEAK_REG has bits as many as the number of the functional blocks. When shifting to a low power state, the low-leakage mode register LOWLEAK_REG is set up first. Then, the clock gating register CLKSTP_REG is set up, and subsequently, the Kick bit is set to "1", indicating that the setup of the clock gating register CLKSTP_REG has been changed. Then, according to the Kick bit set to "1", the controller CTL asserts the VIE signal of the functional block concerned (for example, VIE1_B for the functional block BL_B in FIG. 2) and inputs the low-leakage vector, when the bit of the low-leakage mode register LOWLEAK_REG of the functional block concerned indicates "1." When the input is completed, the controller CTL deasserts the VIE signal, and performs gating of the clock signal of the functional block concerned. On the other hand, when the bit of the low-leakage mode register LOWLEAK_REG of the functional block concerned indicates "0", the controller CTL performs gating of the clock signal immediately. With such configuration, it is possible to set up whether or not a clock signal and a low-leakage vector are inputted for every functional block, and it is also possible to control finely the shift to a low-power consumption mode. Therefore, it becomes possible to reduce the power consumption much more, as compared with the case in the past where only the power gating and the clock gating are used. Since the clock gating register CLKSTP_REG and the low-leakage mode register LOWLEAK_REG are separately provided, it is possible to select the low power consumption accomplished by only the clock gating without inputting a low-leakage vector to each functional block. Accordingly, when the influence of retardation by the overhead time required for inputting the low-leakage vector is great, it is possible to shift more quickly to a low-power consumption state by selecting only the clock gating.

Figure 15:
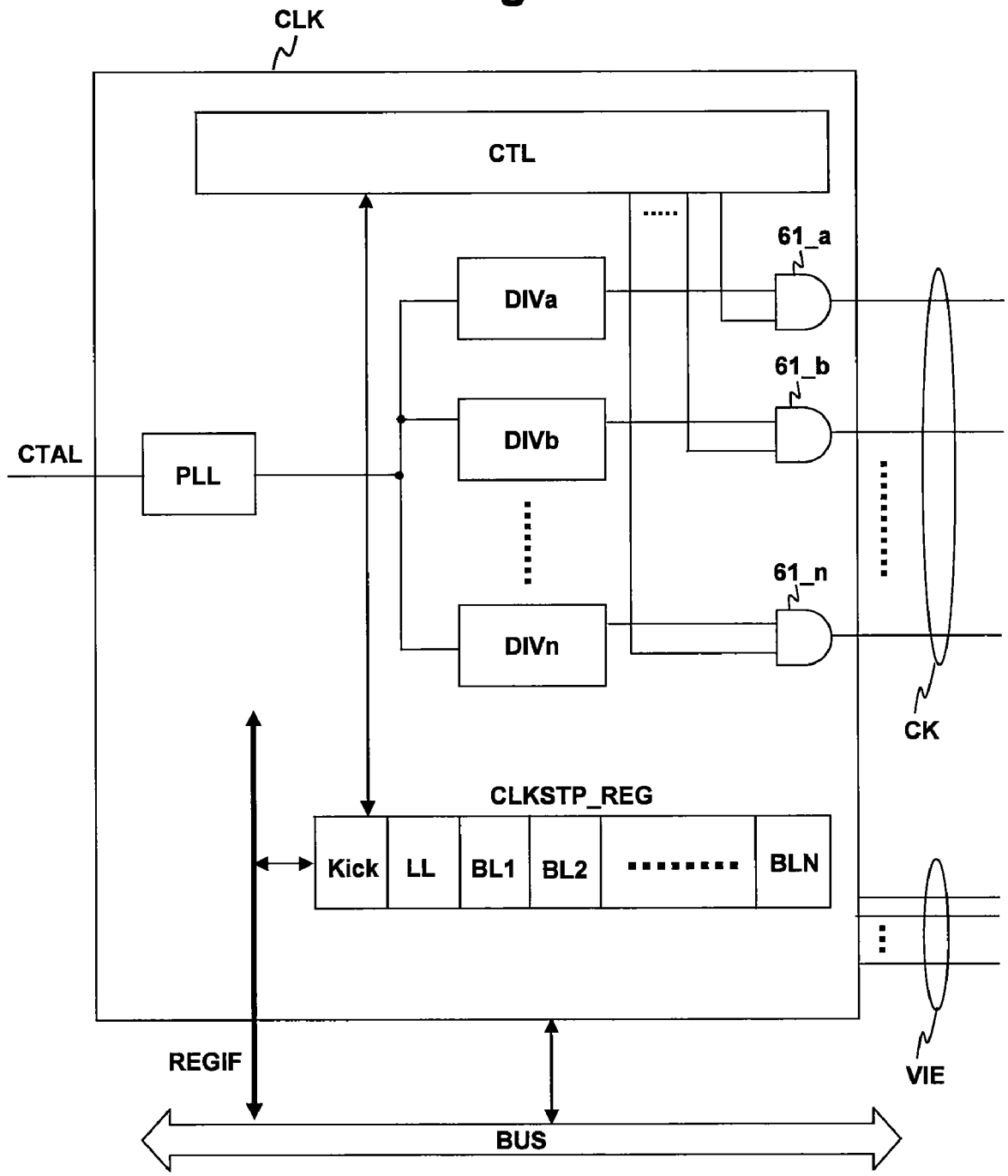
FIG. 15 is a block diagram illustrating another example of configuration of a clock gating register CLKSTP_REG.

FIG. 15 illustrates another example of configuration of the clock gating register CLKSTP_REG. In the present example, a low-leakage mode register LOWLEAK_REG is not provided but a bit LL to enable sending of a VIE signal is provided in the clock gating register CLKSTP_REG, as one of the features. By such configuration, fine control becomes difficult, since a vector must be inputted in common to all the non-operating functional blocks. However, there is an advantage that the control by software becomes easy since the configuration of the register becomes simple.

Figure 16:
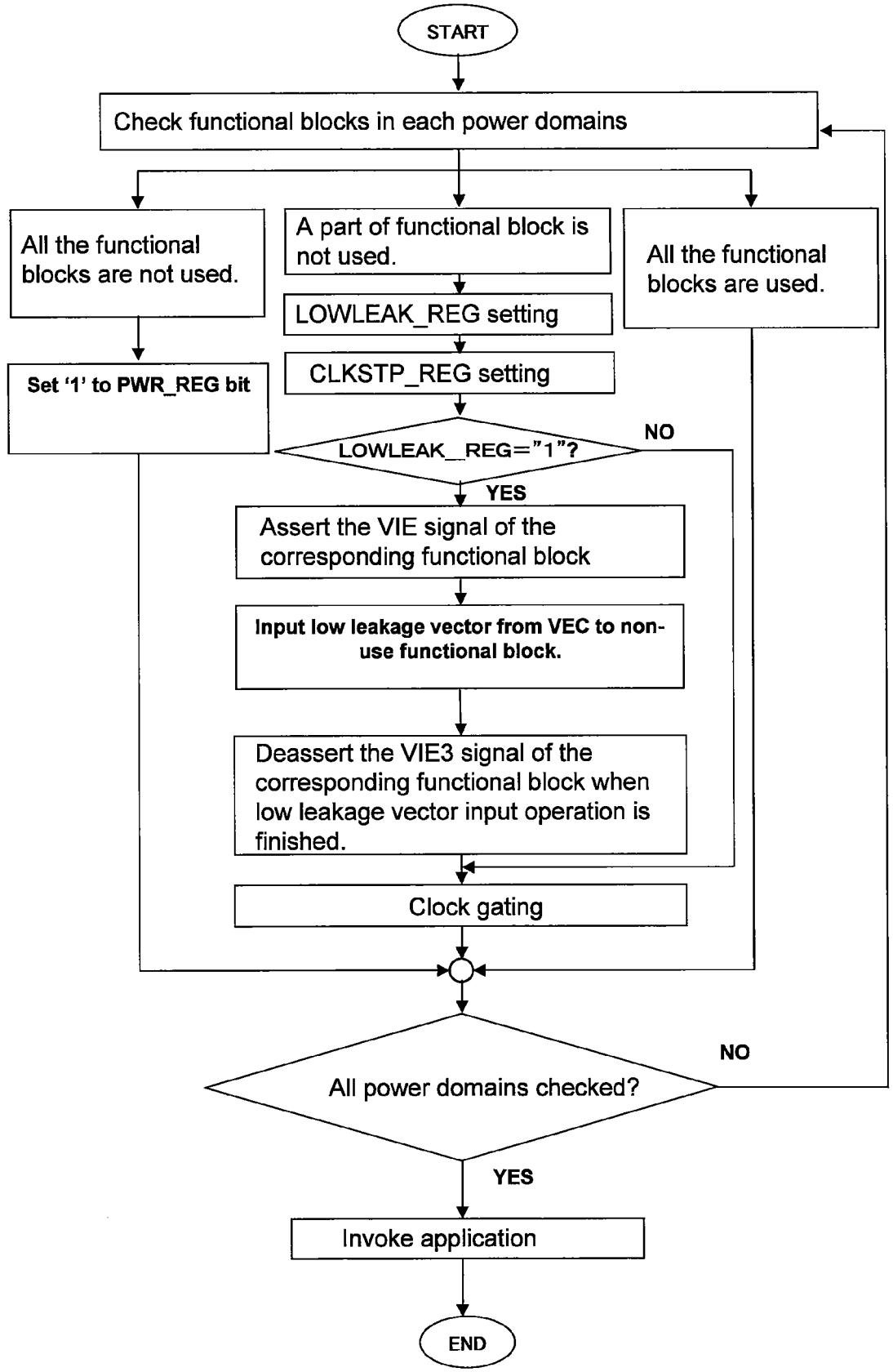
FIG. 16 is a flow chart illustrating operation to shift to a low leakage current state at the time of application execution, according to the first embodiment of the present invention.
Figure 17:
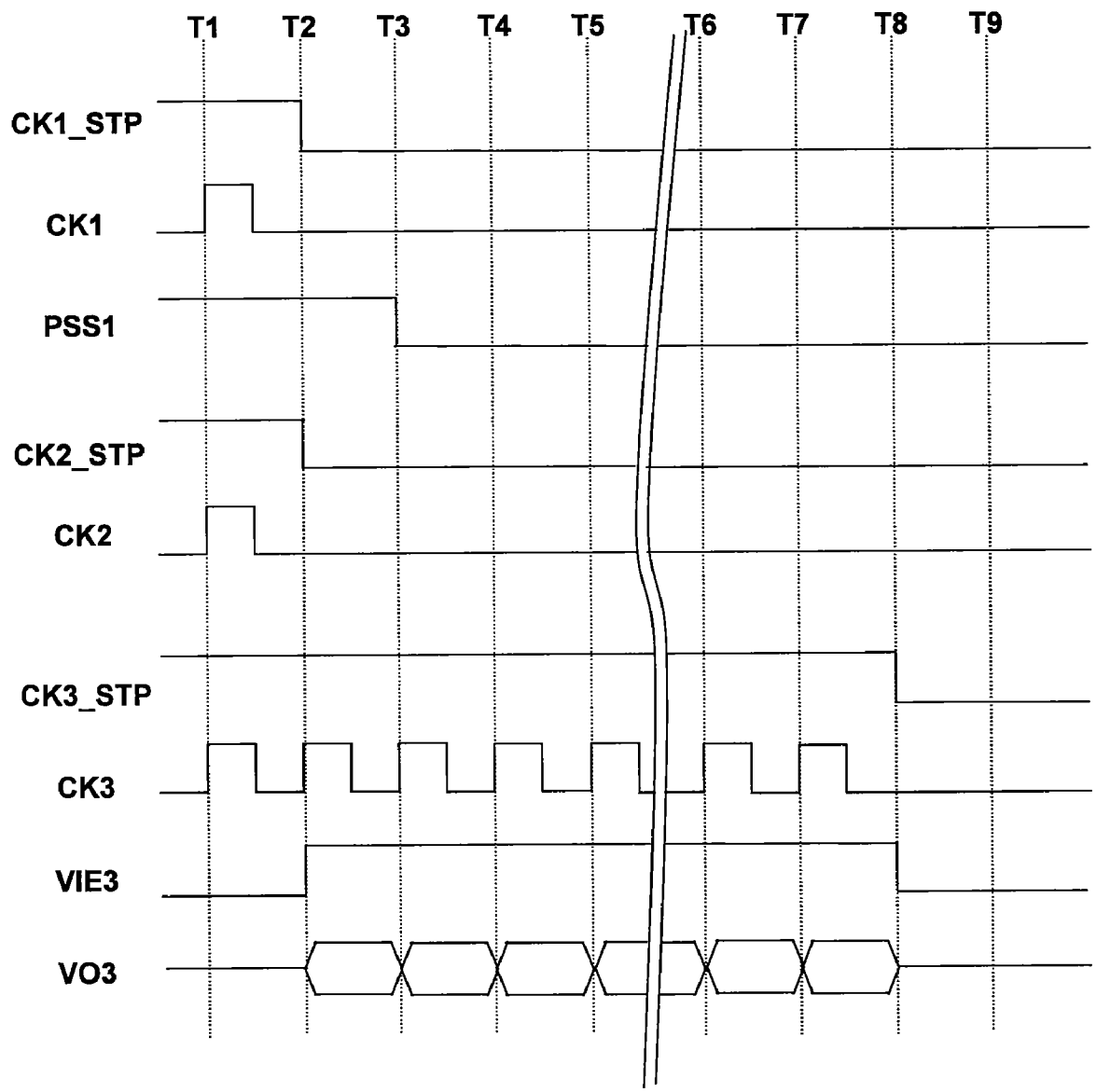
FIG. 17 is a timing chart illustrating operation of FIG. 16.

FIG. 16 illustrates a flow chart in shifting to a low leakage current state at the time of application execution, according to the first embodiment of the present invention. FIG. 17 illustrates the timing chart. In the timing chart of FIG. 17, only signals of a typical functional block which shifts to a low-power operating state are shown.

First, the number of operating functional blocks in each power domain is checked. When all the functional blocks in the power domain are unused, a signal CK1_STP is asserted at time T2, and gating of the clock CK1 is performed. Then, at time T3, a signal PSS1 to turn off the power source corresponding to the power domain concerned is asserted. On the other hand, when all the functional blocks in the power domain are used, there is no setting item for the power domain concerned. The following explains in detail the flow chart for shifting to the low-leakage state when a part of functional blocks in the power domain are used.

The following explains the mode in which both a low-leakage vector input and clock gating are applied to an unused functional block. A bit of the low-leakage mode register LOWLEAK_REG corresponding to the unused functional block is set to "1." Next, a bit of the clock gating register CLKSTP_REG corresponding to the unused functional block is set to "1", and the Kick bit is set to "1" at time T1. The VIE signal of the functional block concerned (VIE3 in FIG. 17) is asserted at time T2. At the edge timing of "1" of the clock signal, a low-leakage vector to shift to a low-leakage state is inputted to the scan flip-flop of the functional block via the scan chain (VO3 in FIG. 17). In this case, since only the functional block which inputs the low-leakage vector is coupled to the scan chain path as described above, time required for shifting to the low-leakage state can be shorten. Furthermore, the clock for inputting the vector is supplied only to the necessary minimum number of functional blocks, therefore, useless clock current is reducible. For example, when inputting a vector into the functional blocks BL_B and BL_C of FIG. 2, the clock is first supplied only to the functional block BL_B, and the clock is supplied to the functional block BL_C after that. By such a procedure, the clock current of the functional block BL_C at the time of supplying the vector to the functional block BL_B is reducible. When the input is completed, the VIE3 signal is deasserted and the gating of the clock signal CK3 of the functional block concerned is performed at the same time. By the above procedure, the used functional block in the power domain can be used as it is, and the unused functional block can shift both of the clock current and the leakage current to the reducible state. Application is practiced when the check of all the power domains is completed.

Next, the following explains the mode in which a low-leakage vector input is not applied and only clock gating is applied to an unused functional block. A bit of the low-leakage mode register LOWLEAK_REG corresponding to the unused functional block is set to "0." A bit of the clock gating register CLKSTP_REG corresponding to the functional block concerned is set to "1", and the Kick bit is set to "1." This operation can be performed simultaneously with the operation which inputs the above-mentioned low-leakage vector. In the present case, inputting of the low-leakage vector to the functional block concerned is not performed, but the signal CK2_STP is immediately asserted and the gating of the clock CK2 is performed to shift to a low-power consumption state. Compared with the case where the low-leakage vector input is concurrently performed, the present case has an advantage that shifting to the low-power consumption state can be performed quickly, since the overhead time required for inputting the low-leakage vector is unnecessary, although the amount of reduction of power consumption is small.

Here, the following technique may be possible to apply for a setup for shifting to the two modes described above.

In the first embodiment, the setup of the low-leakage mode register LOWLEAK_REG and the clock gating register CLKSTP_REG are both performed by software. That is, when the low-leakage vector is inputted, the Kick bit provided in the clock gating register CLKSTP_REG is set to "1" after the input of the low-leakage vector; on the contrary, when the low-leakage vector is not inputted, the Kick bit is set to "1" immediately. Then the gating of the clock signal to the corresponding functional block is performed by the clock controller CTL.

In a second embodiment which employs technique different from the first embodiment, the setup of the low-leakage mode register LOWLEAK_REG is performed by software, and the setup of the clock gating bit corresponding to each functional block in the clock gating register CLKSTP_REG is performed by hardware. That is, when the low-leakage vector is inputted, the Kick bit in the clock gating register CLKSTOP_REG is set to "1" after the input of the low-leakage vector. On the contrary, when the low-leakage vector is not inputted, the Kick bit is set to "1" immediately. Then, taking as a trigger the fact that the Kick bit has been set up, the clock controller CTL performs the clock gating to the corresponding functional block and sets "1" to a bit of the clock gating register CLKSTP_REG corresponding to the functional block concerned.

By the operation described above, it becomes possible to achieve consistency between the value of the clock gating register CLKSTP_REG and the clock supply state for every functional block in both of the first embodiment and the second embodiment.

However, in the second embodiment, in order to achieve the consistency, the clock controller CTL must rewrite the bit in the clock gating register CLKSTP_REG corresponding to the functional block concerned. In order to perform this operation, it is necessary to read out the setup of the clock gating register CLKSTP_REG into the clock controller CTL once and to perform operation on the setup, thereby rewriting the whole bits of the clock gating register CLKSTP_REG. Otherwise, it is necessary to rewrite individually each bit in the clock gating register CLKSTP_REG, by providing additional wiring to each bit.

On the other hand, in the first embodiment, it is possible to achieve the consistency of the clock signal and the clock gating register CLKSTP_REG by simply registering the register by software, and additional operation by the clock controller CTL as well as the additional wiring between the clock controller CTL and the clock gating register CLKSTP_REG become unnecessary. Therefore, the first embodiment is more desirable. When returning to the state of normal operation from the two modes described above, if the consistency is achieved between the state of the clock signal input and the setup of the clock gating register CLKSTP_REG, the return to the normal state from the standby state is readily practiced only by changing the bit of the clock gating register CLKSTP_REG corresponding to the functional block concerned and the Kick bit. This point is also a merit of the first embodiment.

Next, a third and a fourth embodiment are described about whether the low-leakage mode register LOWLEAK_REG is set up dynamically or statically.

In the third embodiment, the low-leakage mode register LOWLEAK_REG is dynamically set up during the application execution. The present embodiment can be applied, for example to a functional block such as the hardware accelerator (VPU) for moving picture encoding/decoding that the operation period for every frame changes greatly with image size. For example, when processing an image with large size, the VPU operation period in one frame becomes long, and the standby time till the processing start in a next frame is short. Therefore, only the clock gating which can shift to a low-power consumption state quickly is performed. On the contrary, when processing an image with small size, the standby time in one frame becomes long. Therefore, the low-leakage vector is inputted and the clock gating is performed, regardless of somewhat long time in shifting to a low-power consumption state. In this way, it is possible to practice the lowest power consumption operation, by setting up the low-leakage mode register LOWLEAK_REG dynamically for every operation.

In the fourth embodiment, the low-leakage mode register LOWLEAK_REG is set up statically. In this case, it is determined in advance whether a low-leakage vector is inputted to each functional block, depending on a circuit scale, the configuration of application, etc. Accordingly, a suitable setup for each functional block is performed and software control of the register becomes easy.

In the above, the invention accomplished by the present inventors has been specifically explained based on the embodiments. However, it cannot be overemphasized that the present invention is not restricted to the embodiments, and it can be changed variously in the range which does not deviate from the gist.

The present invention relates to a semiconductor integrated circuit, in particular, the present invention is effective when applied to a system LSI or a micro-processor for portable devices.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor integrated circuit comprising:
   a first power domain including
      a first functional block having a first flip-flop,
      a second flip-flop, and a first combination logic;
   a second functional block having a third flip-flop, a fourth flip-flop, and a second combination logic;
      a first scan chain including the first flip-flop and the second flip-flop; and
      a second scan chain including the third flip-flop and the fourth flip-flop,
   wherein the semiconductor integrated circuit is configured to be set to one of a first mode, a second mode, and a third mode, and
   wherein the first mode cuts off power to be supplied to the first power domain,
   wherein the second mode inputs a first vector, which is independent of a previous-stage circuit of the first flip-flop and a previous-stage circuit of the second flip-flop, to the first combination logic via the first scan chain, and subsequently cuts off a first clock signal to be supplied to the first functional block, and
   wherein the third mode only cuts off the first clock signal.

2. The semiconductor integrated circuit according to claim 1, further comprising:
   a first register for setting a first bit to select the first vector; and a second register for setting a second bit to select the first clock signal,
wherein, when the first bit is set to a value to select the first vector, the second bit is set subsequently to a value to select the first clock signal.

3. The semiconductor integrated circuit according to claim 1, further comprising:
a second register for setting a first bit to select a second vector which is input to the second combination logic, the second vector being independent of a previous-stage circuit of the third flip-flop and a previous-stage circuit of the fourth flip-flop, and a second bit to select the first clock signal.

4. The semiconductor integrated circuit according to claim 2, further comprising:
a clock controller,
wherein the second register further has a third bit indicative of alteration of setting on input of the first clock signal, and
wherein, when the third bit is set to a value indicating that the alteration of setting has been made, the clock controller cuts off the input of the first clock signal.

5. The semiconductor integrated circuit according to claim 4, further comprising:
a vector supply unit,
wherein, when the third bit is set to a value indicating that the alteration of setting has been made, the clock controller inputs, to the first functional block, a first signal to enable inputting of the first vector, subsequently, the vector supply unit inputs the first vector to the first functional block via the first scan chain, and after the completion of inputting of the first vector, the clock controller cuts off the input of the first clock signal, to shift the semiconductor integrated circuit to the second mode.

6. The semiconductor integrated circuit according to claim 4,
wherein, when the third bit is set to a value indicating that the alteration of setting has been made, the clock controller cuts off the input of the first clock signal to shift the semiconductor integrated circuit to the third mode.

7. The semiconductor integrated circuit according to claim 4,
wherein, when either one of the second mode and the third mode is terminated, the second bit is set to a value to enable inputting of the first clock signal.

8. The semiconductor integrated circuit according to claim 7,
wherein, when the second bit is set to a value to enable inputting of the first clock signal when either one of the second mode and the third mode is terminated, the clock controller supplies the first clock signal.

9. A semiconductor integrated circuit comprising:
a first power domain including
a first functional block having a first flip-flop, a second flip-flop, and a first combination logic;
a second functional block having a third flip-flop, a fourth flip-flop, and a second combination logic;
a first switch operable to supply power to the first power domain;
a first register operable to control the first switch;
a second register for setting a first bit to select a first clock signal input to the first functional block, and a second bit to select a second clock signal input to the second functional block;
a first scan chain including the first flip-flop and the second flip-flop;
a second scan chain including the third flip-flop and the fourth flip-flop; and
a third register for setting a third bit and a fourth bit,
wherein the third register sets the third bit to select a first vector input to the first combination logic via the first scan chain, the first vector being independent of a previous-stage circuit of the first flip-flop and a previous-stage circuit of the second flip-flop, and
wherein the third register sets the fourth bit to select a second vector input to the second combination logic via the second scan chain, the second vector being independent of a previous-stage circuit of the third flip-flop and a previous-stage circuit of the fourth flip-flop.

10. The semiconductor integrated circuit according to claim 9,
wherein the second register further sets a fifth bit to indicate that an alteration of at least one of a value of the first bit and a value of the second bit has been made.

11. The semiconductor integrated circuit according to claim 10, further comprising:
a clock controller,
wherein, when the first bit is set to a value indicating cut-off of the first clock signal when the fifth bit is set to a value indicating that the alteration has been made, the clock controller cuts off the first clock to the first functional block, and
wherein, when the second bit is set to a value indicating cut-off of the second clock signal when the fifth bit is set to a value indicating that the alteration has been made, the clock controller cuts off the second clock signal to the second functional block.

12. The semiconductor integrated circuit according to claim 10, further comprising:
a clock controller; and
a vector supply unit,
wherein, when the first bit is set to a value indicating cut-off of the first clock signal and the third bit is set to a value to enable inputting of the first vector when the fifth bit is set to a value indicating that the alteration has been made, the clock controller inputs, to the first functional block, a first signal to enable inputting of the first vector, and subsequently, the vector supply unit inputs the first vector to the first functional block via the first scan chain, and thereafter the clock controller cuts off input of the first clock signal, and
wherein, when the second bit is set to a value indicating cut-off of the second clock signal and the fourth bit is set to a value to enable inputting of the second vector when the fifth bit is set to a value indicating that the alteration has been made, the clock controller inputs, to the second functional block, a second signal to enable inputting of the second vector, and subsequently, the vector supply unit inputs the second vector to the second functional block via the second scan chain, and thereafter the clock controller cuts off input of the second clock signal.

13. The semiconductor integrated circuit according to claim 10,
wherein the first power domain further includes:
a first bypass circuit;
a second bypass circuit; and
a third bypass circuit,
wherein the first bypass circuit outputs an inputted signal to one of the first functional block and the second bypass circuit, wherein the second bypass circuit outputs a signal inputted from one of the first functional block and the first bypass circuit to one of the second functional block and the third bypass circuit, and wherein the third bypass circuit outputs a signal inputted from one of the second functional block and the second bypass circuit to an exterior of the first power domain.

14. The semiconductor integrated circuit according to claim 13, wherein, when the third bit is set to a value to enable inputting of the first vector, the first bypass circuit is set so as to output a signal to the first functional block, the second bypass circuit is set so as to input a signal from the first functional block, and the first functional block is set so as to input the first vector, wherein, when the third bit is set to a value to disenable inputting of the first vector, the first bypass circuit is set so as to output a signal to the second bypass circuit, and the second bypass circuit is set so as to input a signal from the first bypass circuit, wherein, when the fourth bit is set to a value to enable inputting of the second vector, the second bypass circuit is set so as to output a signal to the second functional block, the third bypass circuit is set so as to input a signal from the second functional block, and the second functional block is set so as to input the second vector, and wherein, when the fourth bit is set to a value to disenable inputting of the second vector, the second bypass circuit is set so as to output a signal to the third bypass circuit, and the third bypass circuit is set so as to input a signal from the second bypass circuit.

15. The semiconductor integrated circuit according to claim 10, wherein the first power domain further includes:
a third functional block;
a first bypass circuit;
a second bypass circuit; and
a third bypass circuit, wherein the third functional block has a fifth flip-flop, a sixth flip-flop, and a third combination logic, and selection of the second clock signal input to the third functional block is determined by setting of the second bit, wherein the first bypass circuit outputs a signal inputted from an exterior of the first power domain to one of the first functional block and the second bypass circuit, wherein the second bypass circuit outputs a signal inputted from one of the first functional block and the first bypass circuit to one of the second functional block and the third bypass circuit, and wherein the third bypass circuit outputs one of a signal inputted from the second functional block via the third functional block and a signal inputted from the second bypass circuit.

16. The semiconductor integrated circuit according to claim 15, wherein, when the third bit is set to a value to enable inputting of the first vector, the first bypass circuit is set so as to output a signal to the first functional block, the second bypass circuit is set so as to input a signal from the first functional block, and the first functional block is set so as to input the first vector, wherein, when the third bit is set to a value to disenable inputting of the first vector, the first bypass circuit is set so as to output a signal to the second bypass circuit, and the second bypass circuit is set so as to input a signal from the first bypass circuit, wherein, when the fourth bit is set to a value to enable inputting of the second vector, the second bypass circuit is set so as to output a signal to the second functional block, the third bypass circuit is set so as to input a signal from the third functional block, and the second functional block and the third functional block are set so as to input the second vector, and wherein, when the fourth bit is set to a value to disenable inputting of the second vector, the second bypass circuit is set so as to output a signal to the third bypass circuit, and the third bypass circuit is set so as to input a signal from the second bypass circuit.

17. The semiconductor integrated circuit according to claim 10, wherein the first functional block further includes:
a fifth flip-flop;
a sixth flip-flop;
a third combination logic; and
a third scan chain including the fifth flip-flop and the sixth flip-flop, wherein the third register further has a sixth bit for selecting a third vector input to the third combination logic via the third scan chain, the third vector being independent of a previous-stage circuit of the fifth flip-flop and a previous-stage circuit of the sixth flip-flop, and wherein the second register has a seventh bit to control enabling and disenabling the third functional block to input a third clock signal, and an eighth bit indicating that any one of the first bit, the second bit, and the seventh bit has been changed.

18. The semiconductor integrated circuit according to claim 10, wherein, when a third signal is inputted from outside of the semiconductor integrated circuit, a first test signal for testing operation of the first combination logic is inputted via the first scan chain, and a second test signal for testing operation of the second combination logic is inputted via the second scan chain.

19. A semiconductor integrated circuit comprising:
a first power domain including
a first functional block having a first flip-flop,
a second flip-flop, and a first combination logic; and
a second functional block having a third flip-flop, a fourth flip-flop, and a second combination logic;
a first switch operable to set enabling and disenabling of power supply to the first power domain;
a first register operable to control the first switch;
a first scan chain including the first flip-flop and the second flip-flop;
a second scan chain including the third flip-flop and the fourth flip-flop; and
a second register for setting a first bit and a second bit,
wherein the first bit is set to select a first clock signal input to the first functional block
wherein the second bit is set to select a second clock signal input to the second functional block, and
wherein a third bit is set to select a first vector and a second vector, the first vector being inputted to the first combination logic via the first scan chain independently of a previous-stage circuit of the first flip-flop and a previous-stage circuit of the second flip-flop, and the second vector being inputted to the second combination logic via the second scan chain independently of a previous-stage circuit of the third flip-flop and a previous-stage circuit of the fourth flip-flop.

20. The semiconductor integrated circuit according to claim 19,
wherein, when the third bit is set to a value to enable inputting of the first vector and the second vector when the first functional block and the second functional block are not operating, the first vector is inputted via the first scan chain, the second vector is inputted via the second scan chain, and then the first clock signal and the second clock signal are cut off, and wherein, when the third bit is set to a value to disenable inputting of the first vector and the second vector when the first functional block and the second functional block are not operating, a second operation is performed in which only the first clock signal and the second clock signal are cut off.

* * * * *